United States Patent
Ando et al.

(10) Patent No.: US 11,559,869 B2
(45) Date of Patent: Jan. 24, 2023

(54) WAFER EDGE POLISHING APPARATUS AND METHOD

(71) Applicant: SUMCO Corporation, Tokyo (JP)

(72) Inventors: Makoto Ando, Tokyo (JP); Tatsunori Izumi, Tokyo (JP); Ryuichi Tanimoto, Tokyo (JP); Yuhei Matsunaga, Tokyo (JP); Yasuo Yamada, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 926 days.

(21) Appl. No.: 16/349,430

(22) PCT Filed: Oct. 2, 2017

(86) PCT No.: PCT/JP2017/035873
§ 371 (c)(1),
(2) Date: May 13, 2019

(87) PCT Pub. No.: WO2018/092440
PCT Pub. Date: May 24, 2018

(65) Prior Publication Data
US 2019/0299354 A1    Oct. 3, 2019

(30) Foreign Application Priority Data

Nov. 15, 2016    (JP) ............................. JP2016-222064

(51) Int. Cl.
*H01L 21/67*    (2006.01)
*B24B 9/06*    (2006.01)
(Continued)

(52) U.S. Cl.
CPC ................ *B24B 9/065* (2013.01); *B24B 9/00* (2013.01); *B24B 55/06* (2013.01); *H01L 21/304* (2013.01);
(Continued)

(58) Field of Classification Search
None
See application file for complete search history.

(56) References Cited

U.S. PATENT DOCUMENTS

| 6,295,683 B1 | 10/2001 | Lai et al. |
| 9,991,110 B2 | 6/2018 | Kozasa et al. |

(Continued)

FOREIGN PATENT DOCUMENTS

| CN | 101656195 A | 2/2010 |
| CN | 204658194 U | 9/2015 |

(Continued)

OTHER PUBLICATIONS

J-Piat translation JP 11-104947 Dressing device for polishing pad, Doi, Apr. 20, 1999 (Year: 1999).*

(Continued)

*Primary Examiner* — Cristi J Tate-Sims
(74) *Attorney, Agent, or Firm* — Greenblum & Bernstein, P.L.C.

(57) ABSTRACT

A wafer edge polishing apparatus includes a cleaning mechanism exhibiting a superb effect of cleaning slurry residue adhered on a chuck table. This edge polishing device is provided with: a chuck table which sucks/holds a wafer; a rotation drive mechanism which rotates the chuck table; an edge polishing unit which polishes an edge of the wafer while supplying slurry to the wafer, which is rotating while being sucked/held by the chuck table; and a cleaning unit which removes slurry residue on the chuck table. The cleaning unit includes a cleaning head, and cleans the chuck table through high-pressure cleaning and brush-cleaning by using the cleaning head, wherein the cleaning head is provided with a high-pressure jet nozzle and a brush surrounding the periphery of the high-pressure jet nozzle.

11 Claims, 9 Drawing Sheets

(51) Int. Cl.
  *B24B 55/06* (2006.01)
  *H01L 21/304* (2006.01)
  *B24B 9/00* (2006.01)
(52) U.S. Cl.
  CPC .. *H01L 21/67028* (2013.01); *H01L 21/67219* (2013.01)

(56) References Cited

U.S. PATENT DOCUMENTS

| | | | |
|---|---|---|---|
| 10,201,888 | B2 | 2/2019 | Yamaguchi et al. |
| 2008/0113510 | A1 | 5/2008 | Kato et al. |
| 2009/0311949 | A1 | 12/2009 | Hayashi et al. |
| 2018/0311783 | A1 | 11/2018 | Terakawa et al. |

FOREIGN PATENT DOCUMENTS

| | | | |
|---|---|---|---|
| JP | H05-121385 | A | 5/1993 |
| JP | H10-166268 | A | 6/1998 |
| JP | H10-256199 | A | 9/1998 |
| JP | 11-104947 | A | 4/1999 |
| JP | 2000-138191 | A | 5/2000 |
| JP | 2000-237700 | A | 9/2000 |
| JP | 2004-79842 | A | 3/2004 |
| JP | 2006-237055 | A | 9/2006 |
| JP | 2009-297842 | A | 12/2009 |
| JP | 2009-302408 | A | 12/2009 |
| JP | 2013-258227 | A | 12/2013 |
| JP | 2013258227 | A * | 12/2013 |
| TW | 201539564 | A | 10/2015 |
| TW | 201608663 | A | 3/2016 |

OTHER PUBLICATIONS

Substrate Holding Stage Cleaning Device and Its Cleaning Method, JP 2003077987A, Kinyuka (Year: 2003).*

Second Office Action issued in Japanese family member Patent Appl. No. 2016-222064, dated Dec. 12, 2017, together with an English-language translation.

First Office Action issued in Japanese family member Patent Appl. No. 2016-222064, dated Sep. 12, 2017, together with an English-language translation.

Notification of Reason for Refusal issued in Republic of Korea family member Patent Appl. No. 2019-7011933, dated Jun. 12, 2020, together with an English-language translation.

International Search Report issued in International Patent Application No. PCT/JP2017/035873, dated Oct. 31, 2017.

Office Action issued in China Counterpart Patent Appl. No. 201780069895.6, dated Aug. 13, 2020.

* cited by examiner

WAFER EDGE POLISHING APPARATUS AND METHOD

TECHNICAL FIELD

The present invention relates to a wafer edge polishing apparatus and method and, more particularly, to a cleaning mechanism for a chuck table for sucking/holding the rear surface of a wafer during polishing.

BACKGROUND ART

Silicon wafers are widely used as a substrate material for semiconductor devices. The silicon wafers are manufactured by sequentially applying processes such as outer peripheral grinding, slicing, lapping, etching, double-sided polishing, single-sided polishing, cleaning, etc., to a silicon single crystal ingot. Particularly, recently, a technique where edge polishing is performed after double-sided polishing on the wafer is becoming mainstream with a view to making not only the front and back surfaces of a wafer but also the edge thereof free of flaws. Patent Document 1 describes a polishing apparatus for a workpiece peripheral portion capable of polishing edge faces on both front and back surfaces of the workpiece and the peripheral face thereof simultaneously.

In a wafer edge polishing process, a slurry residue adhering on a chuck table for sucking/holding a wafer becomes a problem. Abrasive grains remaining on the chuck table can damage the back surface of the wafer. This is because, when the wafer back surface is chucked in a state where the abrasive grains remain on the chuck table, a flaw is generated on the back surface. When edge polishing is performed after the double-sided polishing as described above, only a single-sided polishing process to polish only the wafer front surface is performed after the edge polishing process. That is, there is no opportunity to improve the quality of the wafer back surface, so that the flaw on the wafer back surface generated in the edge polishing process becomes particularly problematic.

To solve the above problem, it is desirable to remove the slurry residue adhering on the chuck table. Concerning the chuck table cleaning method, Patent Document 2 describes a cleaning apparatus for a chuck surface (sucking/supporting surface) of a carrier plate of a semiconductor wafer processing machine. The cleaning apparatus jets cleaning liquid such as pure water at high pressure from a nozzle toward the chuck surface to thereby clean the chuck surface. In this cleaning apparatus, the sucking/supporting surface faces downward, so that foreign matters blown off by the high-pressure cleaning liquid fall together with the cleaning liquid, with the result that the foreign matters adhering on the sucking/supporting surface can be removed without brushing. According to the cleaning apparatus described in Patent Document 2, it is possible to overcome the problem of insufficient detergency in conventional techniques in which the chuck surface is cleaned with a brush while low-pressure water is thrown thereon, and a problem that foreign matters finer than the size of brush hairs cannot be removed and a problem that foreign matters cannot be removed but are merely moved on the chuck surface can be solved.

Further, Patent Document 3 describe s a wafer chamfering device provided with a table cleaning unit that cleans the upper surface of the chuck table. The table cleaning unit includes a cleaning liquid nozzle, an air nozzle, and a cleaning brush which are arranged on the same line. The table cleaning unit is reciprocated along the upper surface of the chuck table with cleaning liquid jetted from the cleaning nozzle, and thus the cleaning brush slides on the upper surface, whereby the upper surface of the chuck table can be subjected to rinse cleaning and brush-cleaning.

CITATION LIST

Patent Document

[Patent Document 1] Japanese Patent Application Laid-Open No. 2009-297842
[Patent Document 2] Japanese Patent Application Laid-Open No. H10-256199
[Patent Document 3] Japanese Patent Application Laid-Open No. 2000-138191

SUMMARY OF THE INVENTION

Problem to be Solved by the Invention

The cleaning method described in Patent Document 2 that cleans the sucking/supporting surface by jetting high-pressure cleaning liquid thereto is effective when the sucking/supporting surface faces downward; however, when the sucking; supporting surface faces upward, the position of the slurry residue only moves slightly, and the slurry residue cannot be removed sufficiently. Further, in the cleaning method described in Patent Document 3 which is a method that rinses and brushes the upper surface of the chuck table, the cleaning liquid nozzle and cleaning brush are arranged on the same line, and the cleaning brush is reciprocated in a direction perpendicular to the arrangement direction thereof, so that the effect of removing the slurry residue deposited in the outer peripheral portion of a circular chuck table is small.

The object of the present invention is therefore to provide a wafer edge polishing apparatus and method using a cleaning mechanism exhibiting a superb effect of cleaning the slurry residue adhered on the chuck table.

Means for Solving the Problem

To solve the above problems, a wafer edge polishing apparatus according to the present invention includes: a chuck table that sucks/holds a wafer; a rotation drive mechanism that rotates the chuck table; an edge polishing unit that polishes an edge of the wafer while supplying slurry to the wafer being rotated in a state of being sucked/held by the chuck table; and a cleaning unit that removes slurry residue on the chuck table. The cleaning unit includes a cleaning head having a high-pressure jet nozzle and a brush provided so as to surround the high-pressure jet nozzle and is configured to clean the chuck table with brush simultaneously with high-pressure cleaning using the cleaning head.

According to the present invention, the slurry residue on the chuck table is blown off by ejection of high-pressure water and, at the same time, the blown-off slurry residue is swept using the brush, whereby the slurry residue can be removed, and the removal rate of the slurry residue can be increased. Further, the slurry residue can be removed while it is enclosed in a brush room surrounding the high-pressure water, so that it is possible to efficiently clean the chuck table while preventing the high-pressure water from splashing. Thus, it is possible to prevent the back surface of the wafer from being damaged during wafer edge polishing process.

In the present invention, the cleaning unit preferably further includes a cleaning head moving mechanism that makes the cleaning head reciprocate in the radial direction of the chuck table. By thus reciprocating the cleaning head, the cleaning effect of the slurry residue on the chuck table can be improved.

In the present invention, it is preferable that the chuck table is provided in a processing chamber and that the cleaning head moving mechanism makes the cleaning head retreat from the processing chamber during an edge polishing step and making the cleaning head enter the processing chamber during a cleaning step. In this case, a wafer carry-in port through which the wafer is fed onto the chuck table in the processing chamber preferably also serves as an entrance for the cleaning head to enter the processing chamber. This allows the cleaning mechanism of the chuck table to be realized with a simple structure.

In the present invention, the wafer to be polished by the edge polishing unit is preferably previously subjected to double-sided polishing in a double-sided polishing step. When the edge polishing is performed after the wafer double-sided polishing, it is necessary to prevent generation of flaws on the wafer back surface due to absence of a process of polishing the wafer back surface after the edge polishing. However, according to the present invention, the generation rate of the flaws on the wafer back surface can be reduced in the edge polishing process, so that it is possible to improve the manufacturing yield of a final wafer product free of flaws on the back surface.

In the present invention, the chuck table preferably vacuum-sucks the wafer. In the thus configured edge polishing apparatus, the slurry residue on the chuck table is a great problem, so that the effect of the present invention is remarkable.

A wafer edge polishing method according to the present invention includes: an edge polishing step of polishing an edge of a wafer being rotated in a state of being sucked/held by a chuck table while supplying slurry to the wafer; and a cleaning step of removing slurry residue on the chuck table. In the cleaning step, a cleaning head having a brush provided so as to surround a high-pressure jet nozzle is used to clean the chuck table with brush simultaneously with high-pressure cleaning.

According to the present invention, the slurry residue on the chuck table is blown off by ejection of high-pressure water and, at the same time, the blown-off slurry residue is swept using the brush, whereby the slurry residue can be removed, and the removal rate of the slurry residue can be increased. Further, the slurry residue can be removed while it is enclosed in a brush room surrounding the high-pressure water, so that it is possible to efficiently clean the chuck table while preventing the high-pressure water from splashing. Thus, it is possible to prevent the back surface of the wafer from being damaged during wafer edge polishing.

In the cleaning step, the cleaning head is preferably reciprocated in the radial direction of the chuck table. By thus reciprocating the cleaning head, the cleaning effect of the slurry residue on the chuck table can be improved.

In the present invention, it is preferable that the chuck table is provided in a processing chamber and that the cleaning head retreats from the processing chamber during the edge polishing step and the cleaning head enters the processing chamber during the cleaning step. In this case, a wafer carry-in port through which the wafer is fed onto the chuck table in the processing chamber preferably also serves as an entrance for the cleaning head to enter the processing chamber. This allows the cleaning mechanism of the chuck table to be realized with a simple structure.

In the present invention, the chuck table preferably vacuum-sucks the wafer in the edge polishing step. In the thus configured edge polishing method, the slurry residue on the chuck table is a great problem, so that the effect of the present invention is remarkable.

In the present invention, the edge polishing step is preferably performed after a double-sided polishing step of polishing both the front and back surfaces of the wafer, and more preferably performed before a single-sided polishing step of mirror-finishing only the front surface of the wafer. When the edge polishing is performed after the wafer double-sided polishing, it is necessary to prevent generation of flaws on the wafer back surface due to absence of a process of polishing the wafer back surface after the edge polishing. However, according to the present invention, the generation rate of the flaws on the wafer back surface can be reduced in the edge polishing process, so that it is possible to improve the manufacturing yield of a final wafer product free of flaws on the back surface.

Advantageous Effects of the Invention

According to the present invention, there can be provided a wafer edge polishing apparatus and method using a cleaning mechanism exhibiting a superb effect of cleaning the slurry residue adhered on the chuck table.

BRIEF DESCRIPTION OF DRAWINGS

FIGS. 5A to 5D are views schematically illustrating an example of the configuration of the edge polishing head 35, wherein FIGS. 5A to 5C are cross-sectional side views, and FIG. 5D is a plan view;

FIGS. 7A and 7B are views illustrating the structure of the cleaning head 52, wherein FIG. 7A is a cross-sectional side view, and FIG. 7B is a plan view;

DETAILED DESCRIPTION OF THE EMBODIMENTS

Hereinafter, a preferred embodiment of the present invention will be described in detail with reference to the accompanying drawings.

Figure 1:
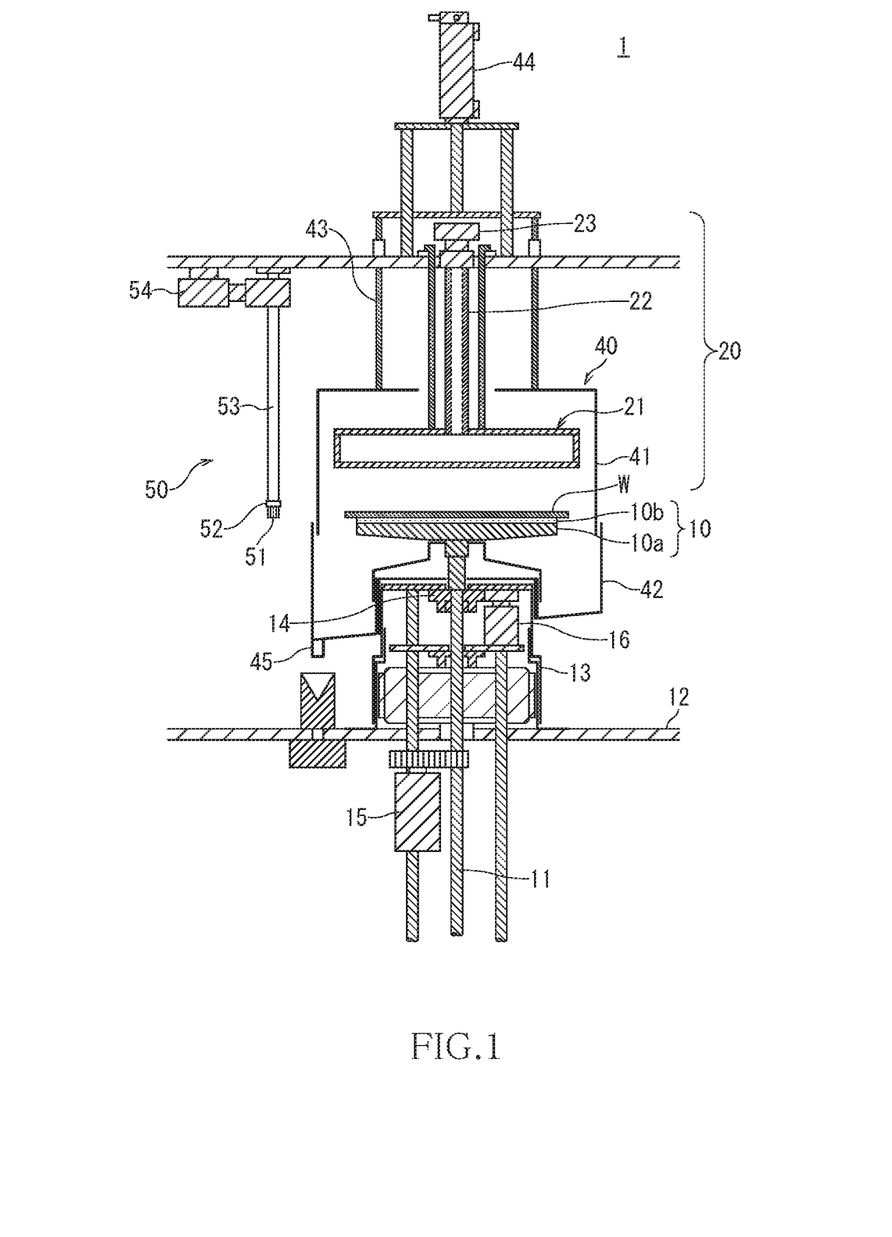
FIG. 1 is a schematic cross-sectional view illustrating a configuration and a standby state of a wafer edge polishing apparatus according to an embodiment of the present invention.
Figure 2:
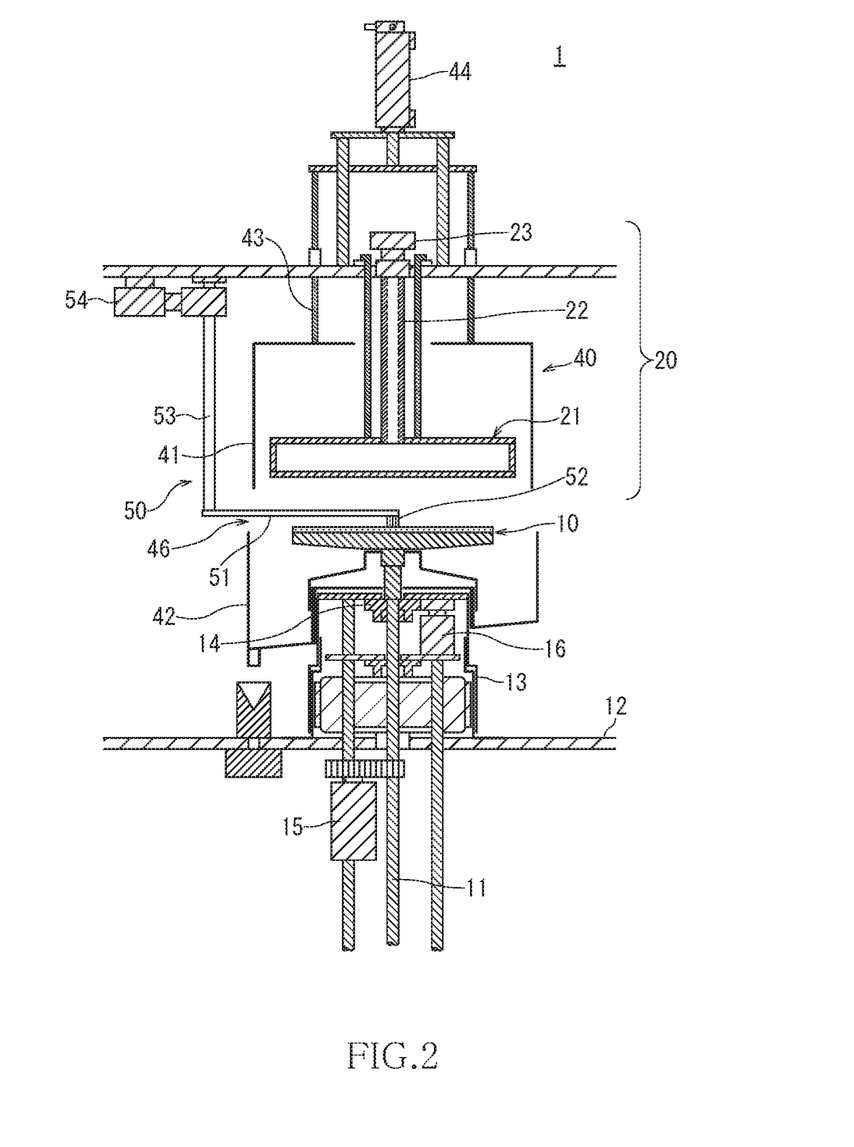
FIG. 2 is a schematic cross-sectional view illustrating a configuration and a chuck table cleaning state of a wafer edge polishing apparatus according to an embodiment of the present invention.
Figure 3:
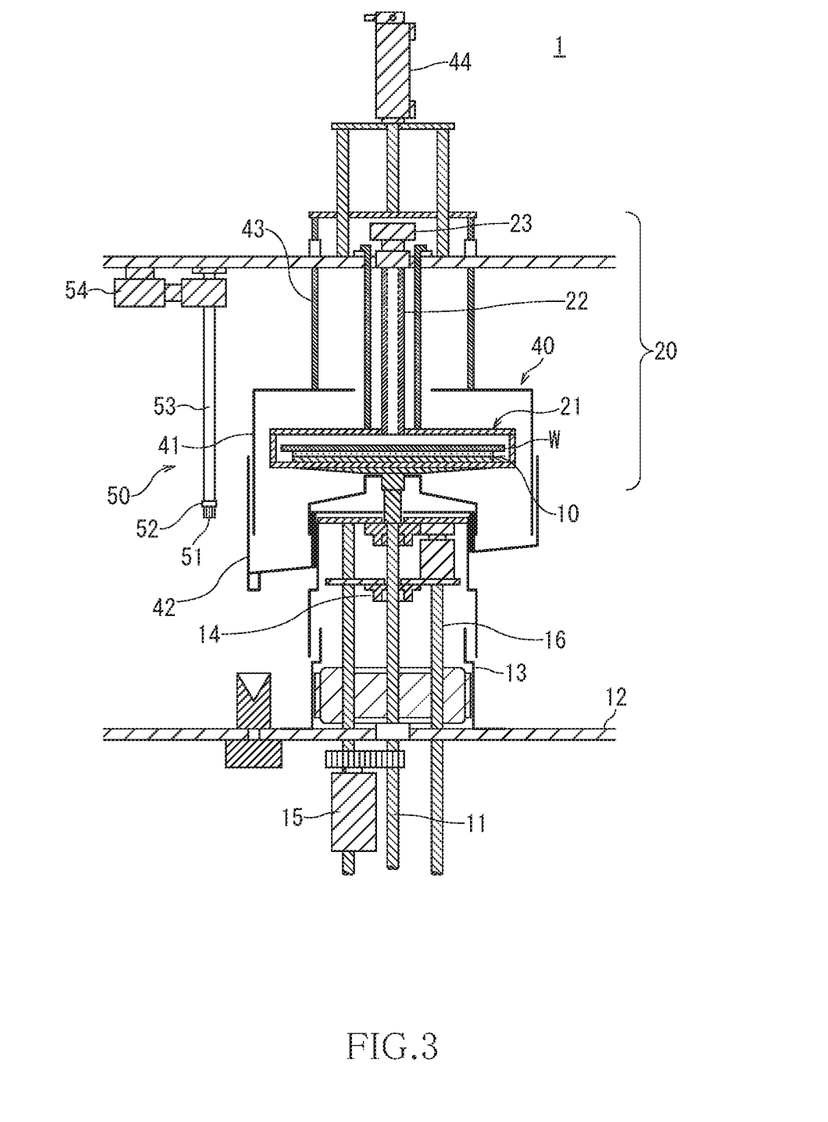
FIG. 3 is a schematic cross-sectional view illustrating a configuration and an edge polishing state of a wafer edge polishing apparatus according to an embodiment of the present invention.

FIGS. 1 to 3 are each a schematic cross-sectional view illustrating a configuration of a wafer edge polishing apparatus according to an embodiment of the present invention. FIG. 1 illustrates a standby state where a chuck table is at a lowered position, FIG. 2 illustrates a chuck table cleaning state, and FIG. 3 illustrates an edge polishing state.

As illustrated in FIGS. 1 to 3, an edge polishing apparatus 1 includes a chuck table 10 that sucks/holds the back surface of a wafer, an edge polishing unit 20 disposed above the chuck table 10, and a cleaning unit 50 that cleans the chuck table 10. The chuck table 10 and edge polishing unit 20 are provided in a processing chamber 40 surrounded by an upper side cover 41 and a lower side cover 42, while the cleaning unit 50 is provided outside the processing chamber 40.

A wafer W to be processed is, e.g., a silicon wafer which is obtained by applying outer peripheral grinding, slicing, lapping, etching, and double-sided polishing to a silicon single crystal ingot manufactured by a CZ method. In general, the double-sided polishing process is performed with the wafer housed in a carrier, so that the end face of the wafer collides with the inner peripheral surface of a wafer loading hole of the carrier through slurry during the double-sided polishing, with the result that the wafer end face after the double-sided polishing is coarser than the wafer front and back surfaces and has many flaws. However, when an edge polishing process is performed after the double-sided polishing process, the flaws on the wafer end face generated during the double-sided polishing process can be sufficiently removed, whereby in a final wafer product, the quality of not only the front and back surfaces, but also the end face can be improved.

The chuck table 10 is obtained by attaching a chuck pad 10b to the upper surface of a chuck table body 10a made of resin, and the upper surface of the chuck pad 10b constitutes an sucking/supporting surface for the wafer W. The chuck pad 10b is made of a material that does not damage the wafer W, such as non-woven fabric, foamed resin, or suede. A number of vent holes are formed in the upper surface of the chuck table 10 and are connected to a vacuum path for guiding negative pressure air. The wafer W placed on the upper surface of the chuck table 10 is vacuum-sucked by the negative pressure air supplied to the vent holes and is thereby held to the chuck table 10.

The chuck table 10 is fixed to the upper end of a rotary shaft 11. The rotary shaft 11 is rotatably supported to a pedestal 13 provided on a support 12 through a bearing 14 and connected to a motor 15 provided below the support 12. As a result, the motor 15 drives the chuck table 10, causing it to rotate together with the rotary shaft 11, As described above, the rotary shaft 11 and motor 15 constitute a rotation drive mechanism that rotates the chuck table 10.

A motor 16 for lifting/lowering the chuck table 10 is provided in the pedestal 13, and the chuck table 10 is lifted/lowered together with the rotary shaft 11 and pedestal 13. The chuck table 10 illustrated in FIGS. 1 and 2 is located at a lowered position (retreat position), and the chuck table 10 illustrated in FIG. 3 is located at a lifted position.

The upper side cover 41 constituting the processing chamber 40 is connected to a cylinder 44 through a lifting arm 43, and when the cylinder 44 lifts the upper side cover 41, the processing chamber 40 is opened. When the upper side cover 41 is lifted as illustrated in FIG. 2, a wafer carry-in port 46 is formed between the upper side cover 41 and the lower side cover 42, and the wafer W to be processed is fed into the processing chamber 40 through the wafer carry-in port 46 and placed on the chuck table 10.

The cleaning unit 50 includes a cleaning arm 51, a cleaning head 52 provided at the tip of the cleaning arm 51, a rotary shaft 53 connected to the based end of the cleaning arm 51, and a motor 54 that drives the rotary shaft 53 to rotate. The cleaning arm 51 is configured to be capable of entering and retreating from the processing chamber 40.

In the present embodiment, the cleaning arm 51 of the cleaning unit 50 is configured to enter the processing chamber 40 through the wafer carry-in port 46. Although the cleaning arm 51 retreats from the processing chamber 40 to be positioned thereoutside during the edge polishing process of the wafer W, it enters the processing chamber 40 during the cleaning process of the chuck table 10 to perform cleaning operation. As described above, the motor 54 and rotary shaft 53 constitute a cleaning head moving mechanism that not only makes the cleaning head 52 reciprocate in the radial direction of the chuck table 10 but also makes the cleaning head 52 retreat from the processing chamber 40 for the edge polishing process and makes the cleaning head 52 enter the processing chamber 40 for the cleaning process, and the cleaning arm 51 can be made to enter the processing chamber 40 utilizing an existing entrance provided in the processing chamber 40.

The edge polishing unit 20 includes a rotary head 21, a hollow shaft 22 that rotatably supports the rotary head 21, and a motor 23 that drives the hollow shaft 22 into rotation. A supply pipe for supplying slurry is incorporated inside the hollow shaft 22, and the slurry is supplied to the center of the front surface of the wafer W. The slurry used for the polishing is discharged through a slurry discharge port 45 formed at the lower end of the inclined bottom surface of the processing chamber 40 and is collected.

Figure 4:
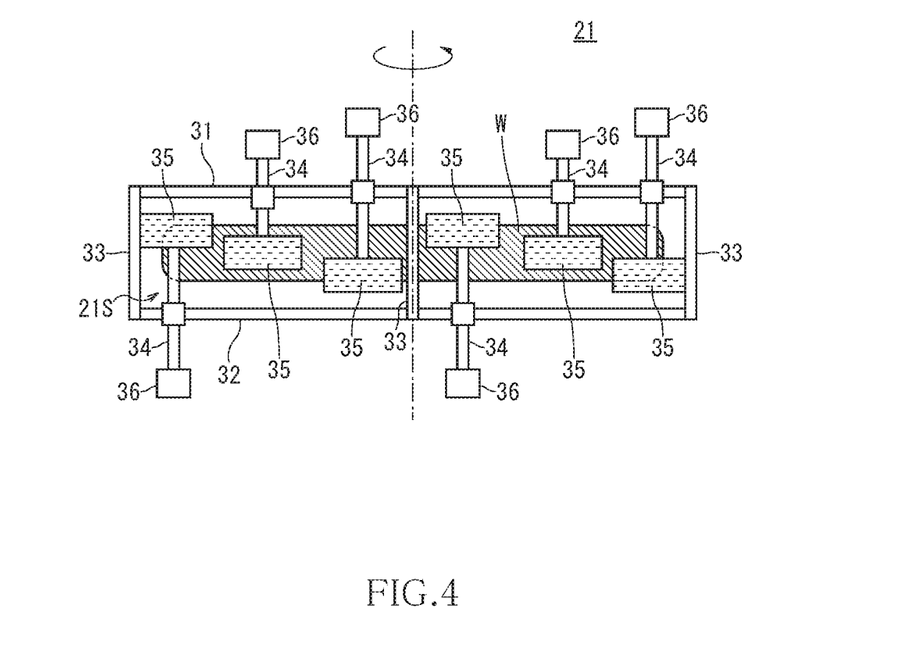
FIG. 4 is a side view schematically illustrating an example of the configuration of the rotary head 21 of the edge polishing unit 20.

FIG. 4 is a side view schematically illustrating an example of the configuration of the rotary head 21 of the edge polishing unit 20.

The rotary head 21 is constituted of an upper ring 31, a ring-shaped lower ring 32 provided below the upper ring 31 in parallel thereto, and a plurality of connecting rods 33 connecting the upper and lower rings 31 and 32. A polishing space 21S is formed between the upper ring 31 and the lower ring 32, and the wafer W is processed in the polishing space 21S. The opening diameter of the lower ring 32 is larger than the diameter (e.g., 450 mm) of the wafer W to be processed. Thus, lifting the chuck table 10 allows the wafer W on the chuck table 10 to enter the polishing space 21S through the opening of the lower ring 32.

The rotary head 21 has a plurality of edge polishing heads 35. The plurality of edge polishing heads 35 are each fixed to the upper ring 31 or lower ring 32 through an edge polishing arm 34. The edge polishing arm 34 is configured to be rotatable about the upper ring 31 or lower ring 32. The edge polishing head 35 is provided at the leading end of the edge polishing arm 34 that is directed toward the polishing space 21S side, and a weight 36 is provided at the base end of the edge polishing arm 34.

Figure 5A:
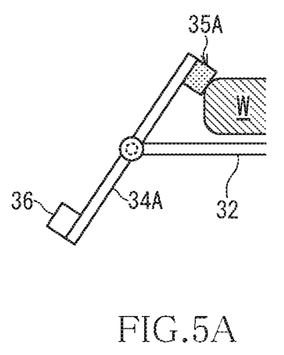
Figure 5B:
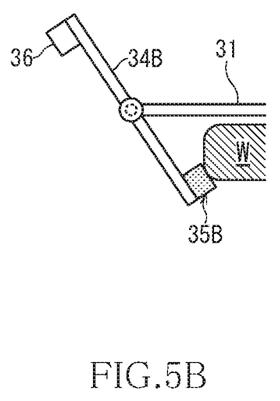
Figure 5C:
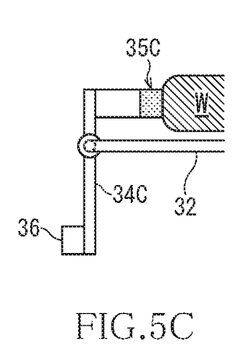
Figure 5D:
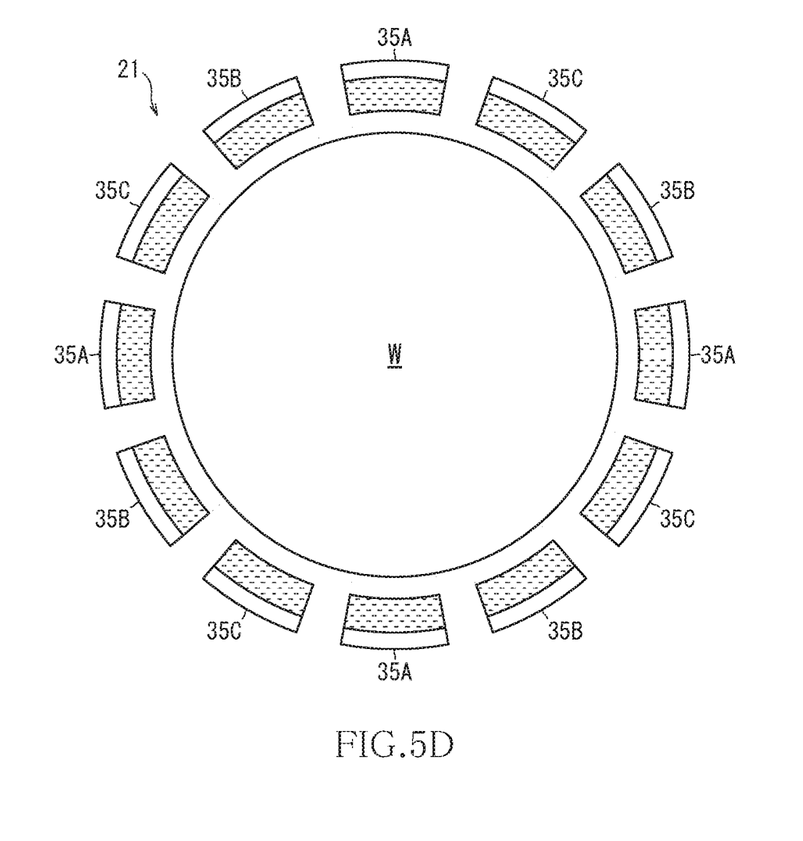

FIGS. 5A to 5D are views schematically illustrating an example of the configuration of the edge polishing head 35. FIGS. 5A to 5C are cross-sectional side views, and FIG. 5D is a plan view.

As illustrated in FIGS. 5A to 5G, there are three types of edge polishing heads 35: an upper polishing head 35A that polishes the upper side of the end face of the wafer W (FIG. 5A); a lower polishing head 35B that polishes the lower side of the end face of the wafer W (FIG. 5B); and a center polishing head 35C that polishes the center of the end face of the wafer W (FIG. 5C). In this case, an upper polishing arm 34A supporting the upper polishing head 35A is preferably axially supported by the lower ring 32, and a lower polishing arm 34B supporting the lower polishing head 35B is preferably axially supported by the upper ring 31. A center polishing arm 34C supporting the center polishing head 35C may be axially supported by the lower ring 32 or upper ring 31. The upper polishing head 35A, lower polishing head 35B, and center polishing head 35C are arranged at equal intervals along the outer periphery of the wafer W as illustrated in FIG. 5D, whereby the edge of the wafer W can be polished in a well-balanced manner.

When the rotary head 21 is rotated, the edge polishing arm 34 is turned to press the edge polishing head 35 against the end face of the wafer W by a centrifugal force F applied to the weight 36 and the principle of leverage using the upper ring 31 or lower ring 32 as a fulcrum. The edge polishing head 35 revolves around the wafer W while pressing the edge of the wafer W, so that the edge of the wafer is polished at an adequate pressure.

The wafer W thus edge-polished becomes a final wafer product through a single-sided polishing process in which only the front surface of the wafer W is mirror-finished and the cleaning process. In the wafer manufacturing method according to the present embodiment, the edge polishing is performed after the double-sided polishing, and there exists no process of polishing the wafer back surface after the edge polishing; however, in the edge polishing apparatus 1, the cleaning process is periodically performed after the edge polishing process to remove slurry residue on the chuck table 10, making it possible to significantly reduce a probability that the wafer back surface is damaged during the edge polishing process. Thus, it is possible to ameliorate defect quality of not only the front and back surfaces of the wafer but also the edge thereof.

Figure 6:
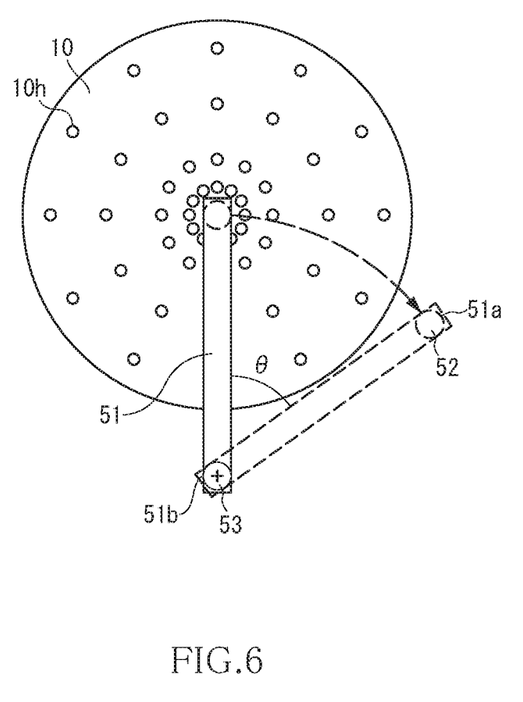
FIG. 6 is a plan view for explaining the operation of the cleaning arm 51 set in the processing chamber 40.

FIG. 6 is a plan view for explaining the operation of the cleaning arm 51 set in the processing chamber 40.

As illustrated in FIG. 6, the cleaning head 52 having a brush is provided at a tip 51a of the cleaning arm 51, and a base end 51b of the cleaning arm 51 is axially supported by the rotary shaft 53. When the rotary shaft 53 is rotated, the cleaning arm 51 swings in a predetermined angle range θ about the base end 51b, causing the cleaning head 52 to reciprocate between the center of the chuck table 10 and the outer peripheral portion thereof in parallel to the upper surface of the chuck table 10 and to clean the upper surface of the chuck table 10 in which vent holes 10h are formed.

Figure 7A:
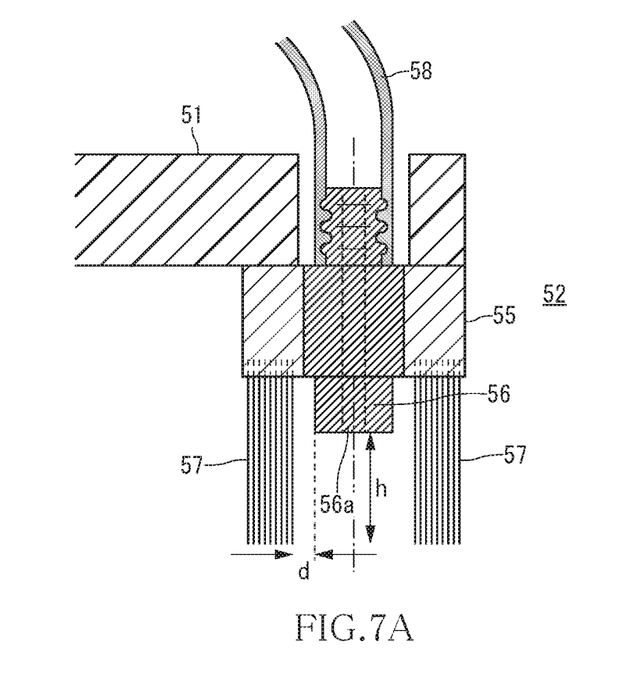
Figure 7B:
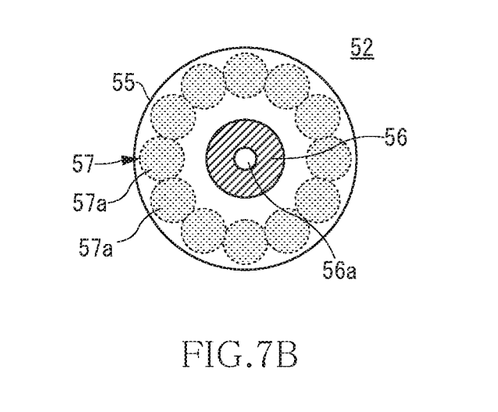

FIGS. 7A and 7B are views illustrating the structure of the cleaning head 52. FIG. 7A is a cross-sectional side view and FIG. 7B is a plan view.

As illustrated in FIGS. 7A and 7B, the cleaning head 52 includes a resin annular base 55 fixed to the cleaning arm 51, a high-pressure jet nozzle 56 that jets cleaning liquid such as pure water, and a brush 57 annularly provided so as to surround the high-pressure jet nozzle 56. The high-pressure jet nozzle 56 is fitted in the hollow portion of the base 55, and the brush 57 is planted in the bottom surface of the base 55.

The brush 57 has a structure in which bristle bundles 57a, each of which is an assembly of a plurality of (e.g., 50) filaments, are arranged around the high-pressure jet nozzle 56 and is annularly provided so as to surround the high-pressure jet nozzle 56. A space width d between the outer diameter of the high-pressure jet nozzle 56 and the brush 57 is preferably 10 mm or more and 20 mm or less. When the space width d is smaller than 10 mm, the space of a room surrounded by the brush 57 is too small to enclose the slurry residue. When the space width d is larger than 20 mm, an effect to sweep the slurry residue raised by high-pressure water with the brush 57 becomes small.

The high-pressure jet nozzle 56 is connected to a tank through a pipe 58 and a pump, and thus cleaning liquid stored in the tank is supplied to the high-pressure jet nozzle 56. The diameter of an opening 56a of the high-pressure jet nozzle 56 is preferably 0.5 mm or more and 2.5 mm or less, and the pressure of the high-pressure jet is preferably around 10 MPa. Further, a height h from the tip of the high-pressure jet nozzle 56 to the tip of the brush 57 is preferably 15 mm or more and 25 mm or less. When the height h is smaller than 15 mm, the space of a room surrounded by the brush 57 is too small to enclose the slurry residue. When the height h is larger than 25 mm, an effect to sweep the slurry residue raised by high-pressure water with the brush 57 becomes small.

Figure 8:
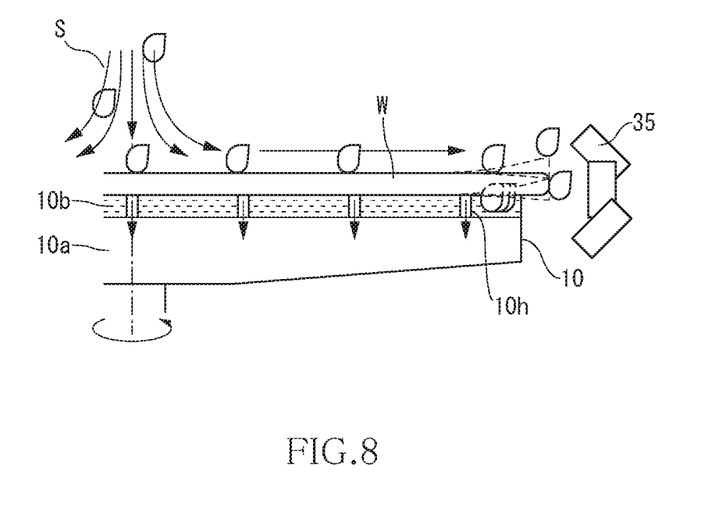
FIG. 8 is a schematic view for explaining a mechanism in which the slurry residue is deposited on the chuck table during the edge polishing process.

FIG. 8 is a schematic view for explaining a mechanism in which the slurry residue is deposited on the chuck table during the edge polishing process.

As illustrated in FIG. 8, when slurry S containing abrasive grains is supplied to the center of the front surface of the wafer W during the edge polishing process, it flows to the outer peripheral side of the wafer W by a centrifugal force generated by rotation of the wafer W to be supplied to the edge polishing head 35, and the edge polishing head 35 traveling along the outer periphery of the wafer W polishes the edge of the wafer W together with the slurry S. At this time, part of the slurry S flows from the front surface side of the wafer W to the back surface side thereof to adhere to the surface of the outer periphery of the chuck pad of the chuck table 10. The back surface of the wafer W is in tight contact with the chuck table 10; however, when the wafer W is rotated at a high speed, the end portion (outer peripheral portion) of the wafer W is vertically vibrated to generate a gap between the wafer W and the chuck table 10, with the result that the slurry residue may adhere to the end portion of the chuck table 10. In order to cope with this, in the present embodiment, the upper surface of the chuck table 10 is cleaned using the cleaning head 52 so as to remove the residue of the slurry S.

Figure 9:
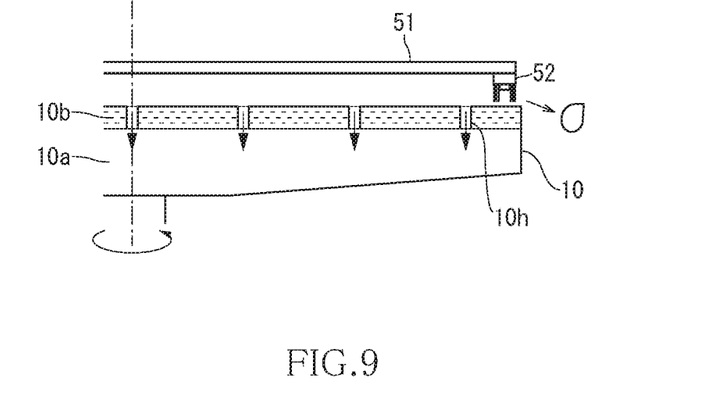
FIG. 9 is a schematic view for explaining the slurry residue cleaning method by the cleaning unit 50.

FIG. 9 is a schematic view for explaining the slurry residue cleaning method by the cleaning unit 50.

As illustrated in FIG. 9, in the cleaning process of the chuck table 10, the cleaning head 52 reciprocates in parallel to the upper surface of the chuck table 10 with the brush of the cleaning head 52 pressed against the outer-periphery of the chuck table 10, whereby the slurry residue adhering on the upper surface of the chuck table 10 is removed. During the cleaning process, high-pressure water is jetted from the high-pressure jet nozzle 56, so that the slurry residue on the chuck table can be blown off, and the slurry residue raised by the high-pressure water can be swept by the brush. Particularly, the slurry residue is swept while it is enclosed in a brush room surrounding the high-pressure water, so that it is possible to efficiently clean the chuck table 10 while preventing the high-pressure water from splashing.

As described above, in the wafer edge polishing apparatus 1 according to the present embodiment, the cleaning head 52 is constituted by a combination of the high-pressure jet nozzle 56 and the annular brush 57 provided around the high-pressure jet nozzle 56, and the chuck table 10 is subjected to brush-cleaning simultaneously with high-pressure cleaning, allowing the slurry residue to be reliably removed. Thus, it is possible to manufacture a wafer having extremely reduced flaws on the back surface thereof.

While the preferred embodiment of the present invention has been described, the present invention is not limited to the above embodiment, and various modifications may be made within the scope of the present invention, and all such modifications are included in the present invention.

Examples

Influence that the presence/absence of the cleaning process of the chuck table had on the quality of the wafer back surface after the edge polishing process was evaluated. As a wafer to be processed, 450 mm silicon wafers obtained by applying outer peripheral grinding, slicing, lapping, etching, and double-sided polishing to a silicon single crystal ingot manufactured by a CZ method were used.

In the evaluation test, after 300 wafers were previously subjected to edge polishing using the edge polishing apparatus 1 illustrated in FIG. 1, the chuck table was cleaned, and five wafers for evaluation were successively subjected to edge polishing. Then, the cleaning and the polishing for five wafers for evaluation cited above were alternately performed five times, respectively. As a result, samples in Example of 25 wafers for evaluation were obtained.

Cleaning conditions of the chuck table were as follows: wafer rotation speed: 200 rpm; wafer rotation direction: counterclockwise direction; number of swings of cleaning head: 37; swing start angle of cleaning head: 50°; swing fold-back angle of cleaning arm: 90° C.). (90°; swing speed of cleaning arm: 10°/sec; pressure of high-pressure jet: 10 MPa; chuck cleaning position: 21 mm; and cleaning time: 5 min. As the chuck pad constituting the sucking/supporting surface of the chuck table, a suede type chuck pad having a thickness of 0.5 mm to 0.8 mm and a compressibility of 2% to 10% was used.

On the other hand, the edge polishing process was successively performed under the same conditions as Example except that the chuck table cleaning process was not performed after five wafers for evaluation were successively subjected to edge polishing, whereby samples in Comparison Example of 25 wafers for evaluation were obtained. That is, in the production of the samples in Comparison Example, after the edge polishing process for 300 wafers, the chuck table cleaning process was performed only once and, afterwards, the chuck table was not cleaned at all.

Thereafter, the back surfaces of the samples in Example and samples in Comparison Example of the wafers for evaluation were measured using a particle counter, and the number of flaws each having a size of 200 nm or more was obtained.

Figure 10:
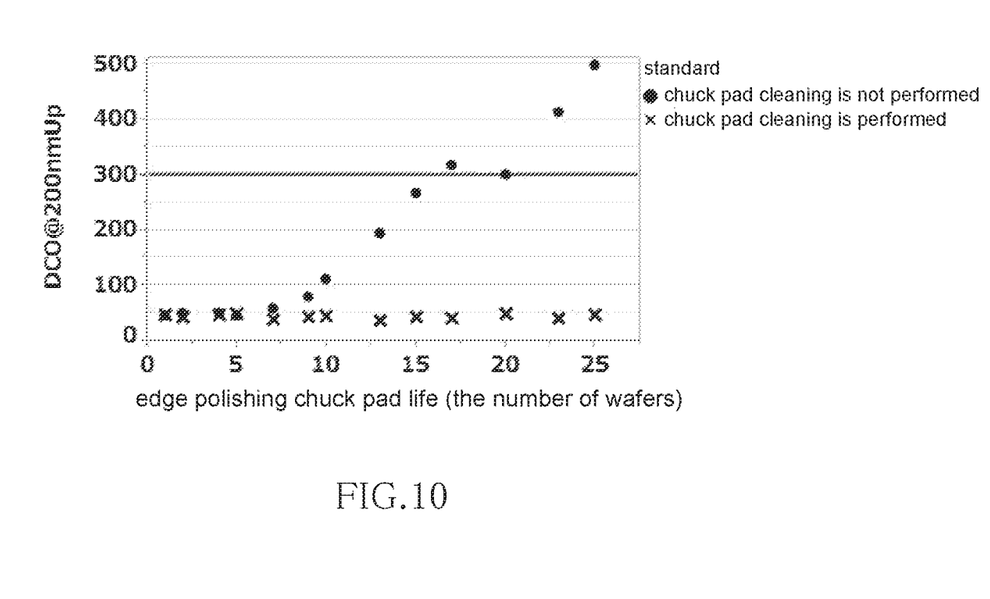
FIG. 10 is a graph illustrating a change in the number of flaws on the wafer back surface associated with an increase in the number of processed wafers (pad life).

FIG. 10 is a graph illustrating a change in the number of flaws on the wafer back surface associated with an increase in the number of processed wafers (pad life).

As illustrated in FIG. 10, in Comparison Example wherein the chuck table cleaning process is not performed, the number of flaws gradually increases with an increase in the number of processed wafers, and the number of flaws exceeds a threshold value (300) in the 15th wafer and reaches about 500 in the 25th wafer. On the other hand, in Example wherein the chuck table cleaning process is performed, the number of flaws always falls below 50 irrespective of an increase in the number of processed wafers. As described above, it has been confirmed that it is possible to reduce the number of flaws on the wafer back surface after the edge polishing by periodically performing the chuck table cleaning process.

REFERENCE SIGNS LIST 1 edge polishing apparatus
10 chuck table
10a chuck table body
10b chuck pad
10h vent holes
11 rotary shaft
12 support
13 pedestal
15 motor (for rotating the chuck table)
16 motor (for lifting/lowering the chuck table)
20 edge polishing unit
21 rotary head
21S polishing space
22 hollow shaft
23 motor (for rotating the rotary head)
31 ring
32 lower ring
33 connecting rods
34 edge polishing arm
34A upper polishing arm
34B lower polishing arm
34C center polishing arm
35 edge polishing head
35A upper polishing head
35B lower polishing head
35C center polishing head
36 weight
40 processing chamber
41 upper side cover
42 lower side cover
43 lifting arm
44 cylinder
45 slurry discharge port
46 wafer carry-in port
50 cleaning unit
51 cleaning arm
51a tip of the cleaning arm
51b base end of the cleaning arm
52 cleaning head
53 rotary shaft
54 motor
55 base
56 high-pressure jet nozzle
56a opening of the high-pressure jet nozzle
57 brush
57a bristle bundles
58 pipe
W wafer
S slurry

What is claimed is:

1. A wafer edge polishing apparatus comprising:
a chuck table that sucks/holds a wafer;
a rotation drive mechanism that rotates the chuck table;
an edge polishing unit that polishes an edge of the wafer while supplying slurry to the wafer being rotated in a state of being sucked/held by the chuck table; and
a cleaning unit that removes slurry residue on the chuck table, wherein
the cleaning unit includes a cleaning head having a high-pressure jet nozzle and a brush provided so as to surround the high-pressure jet nozzle and is configured to clean the chuck table with brush simultaneously with high-pressure cleaning using the cleaning head.

2. The wafer edge polishing apparatus as claimed in claim 1, wherein the cleaning unit further includes a cleaning head moving mechanism that makes the cleaning head reciprocate in the radial direction of the chuck table.

3. The wafer edge polishing apparatus as claimed in claim 2, wherein the chuck table is provided in a processing chamber and the cleaning head moving mechanism makes the cleaning head retreat from the processing chamber during an edge polishing process and making the cleaning head enter the processing chamber during a cleaning process.

4. The wafer edge polishing apparatus as claimed in claim 1, wherein the wafer to be polished by the edge polishing unit is previously subjected to double-sided polishing in a double-sided polishing process.

5. The wafer edge polishing apparatus as claimed in claim 1, wherein the chuck table vacuum-sucks the wafer.

6. A wafer edge polishing method comprising:
   polishing an edge of a wafer being rotated in a state of being sucked/held by a chuck table while supplying slurry to the wafer; and
   removing slurry residue on the chuck table
   by providing a cleaning head having a brush so as to surround a high-pressure jet nozzle, which is used to clean the chuck table with the brush simultaneously with high-pressure cleaning.

7. The wafer edge polishing method as claimed in claim 6, wherein the cleaning head is reciprocated in the radial direction of the chuck table.

8. The wafer edge polishing method as claimed in claim 6, wherein the chuck table is provided in a processing chamber and the cleaning head retreats from the processing chamber during the polishing of the edge, and the cleaning head enters the processing chamber during the removing of the slurry residue.

9. The wafer edge polishing method as claimed in claim 6, wherein the polishing of the edge is performed after double-sided polishing of both the front and back surfaces of the wafer.

10. The wafer edge polishing method as claimed in claim 6, wherein the chuck table vacuum-sucks the wafer in the polishing of the edge.

11. The wafer edge polishing method as claimed in claim 6, wherein the polishing of the edge is performed before single-sided polishing of mirror-finishing only the front surface of the wafer.

* * * * *